US012516417B2

(12) United States Patent
Bapat et al.

(10) Patent No.: US 12,516,417 B2
(45) Date of Patent: Jan. 6, 2026

(54) FACELESS SHOWERHEAD

(71) Applicant: Lam Research Corporation, Fremont, CA (US)

(72) Inventors: Shriram Vasant Bapat, Beaverton, OR (US); Pankaj Ghanshyam Ramnani, Wilsonville, OR (US); Brian Joseph Williams, Tigard, OR (US); Christopher Matthew Jones, Woodburn, OR (US); Curtis W. Bailey, West Linn, OR (US); Emile Draper, Molalla, OR (US); Nagraj Shankar, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 69 days.

(21) Appl. No.: 18/029,641

(22) PCT Filed: Oct. 8, 2021

(86) PCT No.: PCT/US2021/054152
§ 371 (c)(1),
(2) Date: Mar. 30, 2023

(87) PCT Pub. No.: WO2022/076809
PCT Pub. Date: Apr. 14, 2022

(65) Prior Publication Data

US 2023/0366089 A1 Nov. 16, 2023

Related U.S. Application Data

(60) Provisional application No. 63/089,969, filed on Oct. 9, 2020.

(51) Int. Cl.

| | |
|---|---|
| ***C23C 16/455*** | (2006.01) |
| ***C23C 16/505*** | (2006.01) |
| ***H01J 37/32*** | (2006.01) |

(52) U.S. Cl.
CPC .. *C23C 16/45565* (2013.01); *C23C 16/45563* (2013.01); *C23C 16/505* (2013.01); *H01J 37/32449* (2013.01)

(58) Field of Classification Search
CPC ............ C23C 16/455; C23C 16/45563; C23C 16/45565; C23C 16/45587;
(Continued)

(56) References Cited

U.S. PATENT DOCUMENTS 5,746,875 A * 5/1998 Maydan ............ C23C 16/45574
118/723 R
5,792,269 A * 8/1998 Deacon ............ C23C 16/45565
156/345.34
(Continued)

FOREIGN PATENT DOCUMENTS

CN 115698375 A 2/2023
EP 1180785 A2 2/2002
(Continued)

OTHER PUBLICATIONS

International Application Serial No. PCT/US2021/054152, International Search Report mailed Jan. 14, 2022, 4 pgs.
(Continued)

*Primary Examiner* — Benjamin Kendall
(74) *Attorney, Agent, or Firm* — Schwegman Lundberg & Woessner, P.A.

(57) ABSTRACT

In some examples, a faceless showerhead comprises a body including a backing plate, the body devoid of a faceplate or plenum; a gas supply stem to admit gas into the showerhead; and a baffle supported adjacent the backing plate or the gas supply stem. The faceless showerhead may further comprise at least one support element for supporting the baffle in a baffle cavity in the backing plate or the gas supply stem.

10 Claims, 8 Drawing Sheets

(58) Field of Classification Search
CPC ............ C23C 16/45591; C23C 16/505; C23C 16/509; H01J 37/3244; H01J 37/32449; H01L 21/67017
See application file for complete search history.

(56) References Cited

U.S. PATENT DOCUMENTS

| | | | | |
|---|---|---|---|---|
| 2003/0106490 | A1 * | 6/2003 | Jallepally | C23C 16/45565 117/89 |
| 2005/0133161 | A1 * | 6/2005 | Carpenter | C23C 16/45544 156/345.34 |
| 2005/0199184 | A1 | 9/2005 | Murugesh et al. | |
| 2008/0121179 | A1 | 5/2008 | Park et al. | |
| 2015/0315706 | A1 * | 11/2015 | Chandrasekharan | C23C 16/45591 |
| 2017/0301515 | A1 * | 10/2017 | Madsen | C23C 16/45565 |
| 2019/0390344 | A1 | 12/2019 | Mai et al. | |

FOREIGN PATENT DOCUMENTS

| | | | |
|---|---|---|---|
| JP | 2001140078 | 5/2001 | |
| JP | 2001152344 | 6/2001 | |
| JP | 2009117521 | 5/2009 | |
| JP | 2014130803 A | 7/2014 | |
| JP | 2023544486 | 10/2023 | |
| KR | 10-2016-0108176 * | 9/2016 | H01L 21/02 |
| TW | 201937994 | 9/2019 | |
| WO | WO-2022076809 A1 | 4/2022 | |

OTHER PUBLICATIONS

International Application Serial No. PCT/US2021/054152, Written Opinion mailed Jan. 14, 2022, 5 pgs.
"International Application Serial No. PCT US2021 054152, International Preliminary Report on Patentability mailed Apr. 20, 2023", 7 pgs.
"Korean Application Serial No. 10-2022-7044602, Voluntary Amendment filed Oct. 7, 2024", w English claims, 2 pgs.
"Taiwanese Application Serial No. 110137157, Office Action mailed Mar. 13, 2025", w Machine English Translation, 17 pgs.
"Japanese Application Serial No. 2023-513557, Notification of Reasons for Rejection mailed Apr. 15, 2025", W English Translation, 6 pgs.
"Taiwanese Application Serial No. 110137157, Response filed Jun. 6, 2025 to Office Action mailed Mar. 13, 2025", w English Claims, 16 pgs.
"Japanese Application Serial No. 2023-513557, Decision of Rejection mailed Sep. 2, 2025", w English Translation, 4 pgs.

* cited by examiner

FACELESS SHOWERHEAD

CLAIM OF PRIORITY

This application is a U.S. National Stage Filing under 35 U.S.C. 371 from International Application No. PCT/US2021/054152, filed on Oct. 8, 2021, and published as WO 2022/076809 A1 on Apr. 14, 2022, which claims the benefit of priority to U.S. Patent Application Ser. No. 63/089,969, filed on Oct. 9, 2020, each of which is incorporated by reference herein in its entirety.

FIELD

The present disclosure relates generally to a showerhead for substrate processing applications, and more particularly to a faceless showerhead for aluminum oxide (AlOx) processes.

BACKGROUND

Conventional showerheads typically include a plenum connected to multiple holes in a faceplate to distribute precursor gases (precursors) into a processing chamber to achieve a desired on-wafer uniformity or feature creation on a substrate, for example. The existence of a plenum and thousands of holes can significantly increase the cost of showerhead. In one problematic aspect, in view of high deposition rates in AlOx processes, AlOx process hardware can become prone to flaking and particle generation. Other such issues may not be tied to deposition rates. For example, there is a difficulty in using conventional dry etch methods of in-situ cleaning of components such as a showerhead. Without in-situ cleaning, a film will build up over time and flake. Addressing this situation may require multiple wet cleans and part replacement, thereby increasing inventory, wastage and labor costs at a manufacturing site.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

BRIEF SUMMARY

In some examples, a faceless showerhead comprises a body including a backing plate, the body devoid of a faceplate or plenum; a gas supply stem to admit gas into the showerhead; and a baffle supported adjacent the backing plate or the gas supply stem.

In some examples, the faceless showerhead further comprises at least one support element for supporting the baffle in a baffle cavity in the backing plate or the gas supply stem.

In some examples, a diameter of the backing plate is in a range 12 mm-105 mm. In some examples, a diameter of the baffle is in a range 2.5 mm-13 mm.

In some examples, a thickness of the baffle is in a range 0.5 mm-3 mm. In some examples, a separation distance between the baffle and the backing plate is in a range 0.1 mm-6 mm. In some examples, a separation distance between the baffle and the gas supply stem is in a range 0.5 mm-6 mm.

In some examples, the baffle includes an arrangement of one or more through-holes, and wherein a diameter of a through-hole is in a range 0.2 mm-10 mm. In some examples, a diameter of an inner or outer circular pattern of the through-hole arrangement is in a range 2 mm-100 mm. In some examples, a diameter of the support element is in a range 1 mm-10 mm, and a length of the support element is in a range 0.5 mm-6 mm.

BRIEF DESCRIPTION OF THE SEVERAL VIEWS OF THE DRAWINGS

Some embodiments are illustrated by way of example and not limitation in the views of the accompanying drawings.

DETAILED DESCRIPTION

Figure 1:
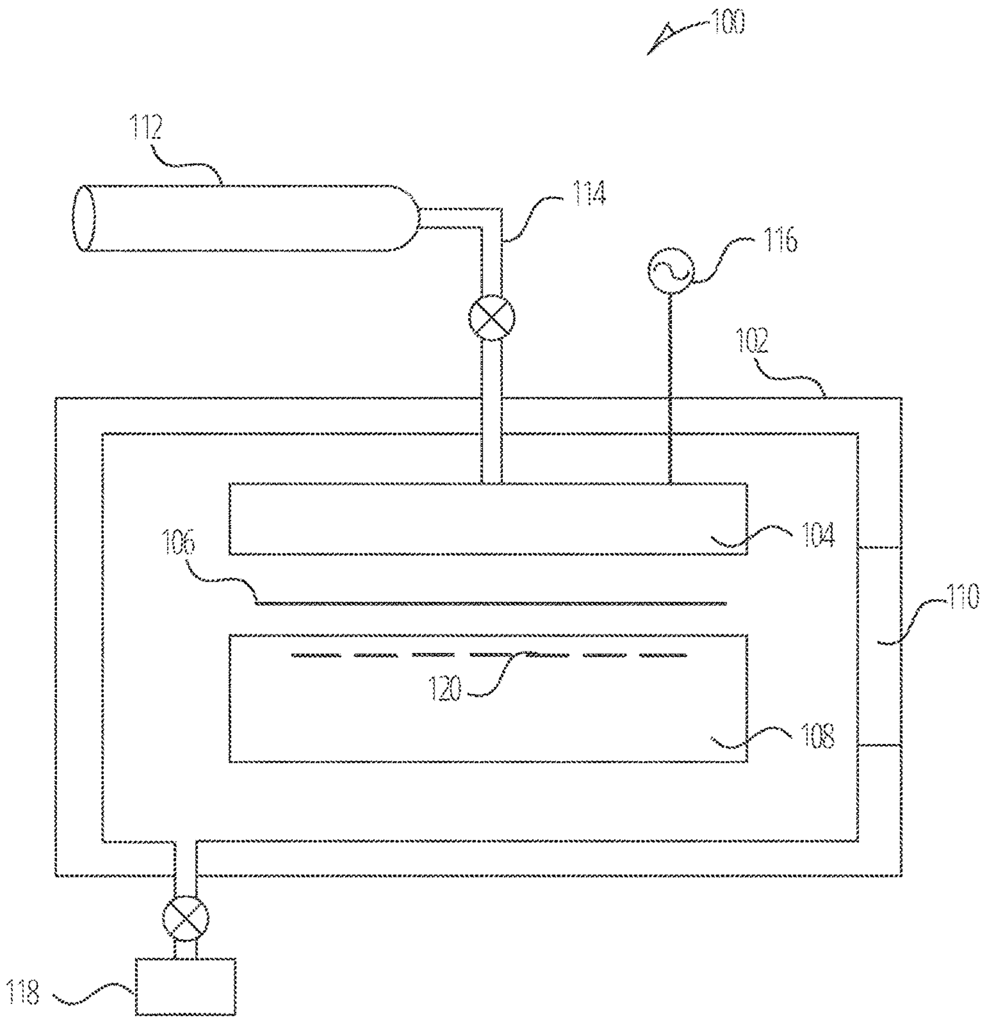
FIG. 1 is a schematic diagram of a processing chamber within which some examples of the methods of the present disclosure may be employed.

The description that follows includes systems, methods, techniques, instruction sequences, and computing machine program products that embody illustrative embodiments of the present disclosure. In the following description, for purposes of explanation, numerous specific details are set forth in order to provide a thorough understanding of example embodiments. It will be evident, however, to one skilled in the art that the present disclosure may be practiced without these specific details.

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright Lam Research Corporation, 2020, All Rights Reserved.

Conventional precursor delivery systems employ a plenum of one sort or another. The existence of a plenum can lead to the disadvantages described above. Deposition can become trapped in an inaccessible plenum or inside thousands of tiny holes. It will be appreciated that cleaning the inside of a conventional plenum or holes can be difficult and costly.

Thus, in one aspect, this disclosure seeks to provide a low-cost version of a showerhead for substrate processing, for example AlOx-based processes. Some present examples eliminate a plenum requirement. Process optimization can be addressed through baffle design and chemistry types, as described further below. Some examples reduce the cost of the showerhead and maintenance cost. Some embodiments employ a configuration that significantly reduces hardware costs while meeting desired functional specifications, for example in AlOx processes.

With reference now to FIG. 1, an example arrangement 100 of a plasma-based processing chamber is shown. The present subject matter may be used in a variety of semiconductor manufacturing and substrate processing operations, but in the illustrated example, the plasma-based processing chamber is described in the context of plasma-enhanced or radical-enhanced Chemical Vapor Deposition (CVD) or Atomic Layer Deposition (ALD) operations.

The skilled artisan will also recognize that other types of ALD processing techniques, such as AlOx processes, are known (e.g., thermal-based ALD operations) and may incorporate a non-plasma-based processing chamber. An ALD tool is a specialized type of CVD processing system in which ALD reactions occur between two or more chemical species. The two or more chemical species are referred to as precursor gases and are used to form a thin film deposition of a material on a substrate, such as a silicon wafer as used in the semiconductor industry. The precursor gases are sequentially introduced into an ALD processing chamber and react with a surface of the substrate to form a deposition layer. Generally, the substrate repeatedly interacts with the precursors to deposit slowly an increasingly thick layer of one or more material films on the substrate. In certain applications, multiple precursor gases may be used to form various types of film or films during a substrate manufacturing process.

FIG. 1 is shown to include a processing chamber 102 in which a showerhead 104 and a substrate-support assembly 108 or pedestal are disposed. The showerhead 104 may be a showerhead electrode. Typically, the substrate-support assembly 108 seeks to provide a substantially-isothermal surface and may serve as both a heating element and a heat sink for a substrate 106. The substrate-support assembly 108 may comprise an Electrostatic Chuck (ESC) in which heating elements are included to aid in processing the substrate 106, as described above. The substrate 106 may include a wafer comprising, for example, elemental-semiconductor materials (e.g., silicon (Si) or germanium (Ge)) or compound-semiconductor materials (e.g., silicon germanium (SiGe) or gallium arsenide (GaAs)). Additionally, other substrates include, for example, dielectric materials such as quartz, sapphire, semi-crystalline polymers, or other non-metallic and non-semiconductor materials.

In operation, the substrate 106 is loaded through a loading port 110 onto the substrate-support assembly 108. A gas line 114 can supply one or more process gases (e.g., precursor gases) to the showerhead 104. In turn, the showerhead 104 delivers the one or more process gases into the plasma-based processing chamber 102. A gas source 112 (e.g., one or more precursor gas ampules) to supply the one or more process gases is coupled to the gas line 114. In some examples, an RF (radio frequency) power source 116 is coupled to the showerhead 104. In other examples, a power source is coupled to the substrate-support assembly 108 or ESC.

Prior to entry into the showerhead 104 and downstream of the gas line 114, a point-of-use (POU) and manifold combination (not shown) controls entry of the one or more process gases into the plasma-based processing chamber 102. Typically, and with reference to a conventional showerhead 202 illustrated in FIG. 2, precursor gases may be mixed in or distributed via a plenum 204 of the showerhead 104.

In operation, the plasma-based processing chamber 102 is evacuated by a vacuum pump 118. RF power is capacitively coupled between the showerhead 104 and a lower electrode 120 contained within or on the substrate-support assembly 108. The substrate-support assembly 108 is typically supplied with two or more RF frequencies. For example, in various embodiments, the RF frequencies may be selected from at least one frequency at about 1 MHz, 2 MHz, 13.56 MHz, 27 MHz, 60 MHz, and other frequencies as desired. A coil designed to block or partially block a particular RF frequency can be designed as needed. Therefore, particular frequencies discussed herein are provided merely for ease in understanding. The RF power is used to energize the one or more process gases into a plasma in the space between the substrate 106 and the showerhead 104. The plasma can assist in depositing various layers (not shown) on the substrate 106. In other applications, the plasma can be used to etch device features into the various layers on the substrate 106. RF power is coupled through at least the substrate-support assembly 108. The substrate-support assembly 108 may have heaters incorporated therein. The detailed design of the processing chamber 102 may vary and it may, or may not, be plasma-based in use of present example showerheads.

Figure 2:
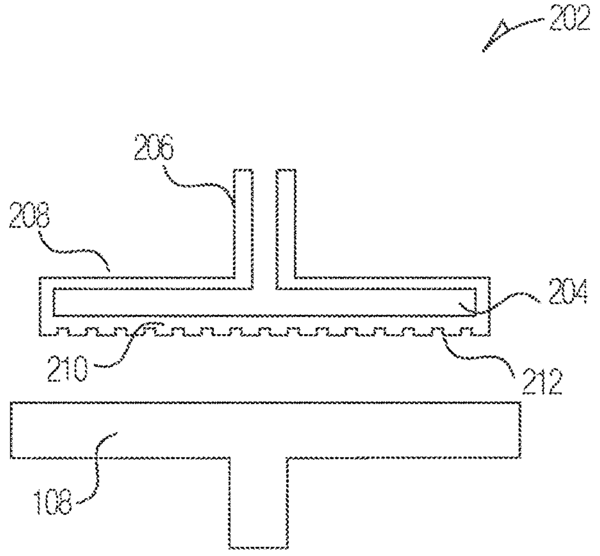
FIG. 2 (Prior Art)
FIG. 2 illustrates an aspect of a conventional showerhead matter in accordance with one embodiment.

FIG. 2 illustrates a general arrangement of a conventional showerhead 202 for use in a processing chamber such as a processing chamber 102 described above. The conventional showerhead 202 includes a gas supply stem 206 in communication with an internal plenum 204 of the conventional showerhead 202. The conventional showerhead 202 includes a backplate 208 and a faceplate 210. The backplate 208 and faceplate 210 may define walls of the plenum 204. The faceplate 210 includes holes 212 formed therein. The holes 212 may be several thousand in number. The holes 212 distribute precursors for processing a substrate (such as a wafer) supported on the substrate-support assembly 108 in the processing chamber 102. The conventional showerhead 202 suffers from the disadvantages described above.

Figure 3:
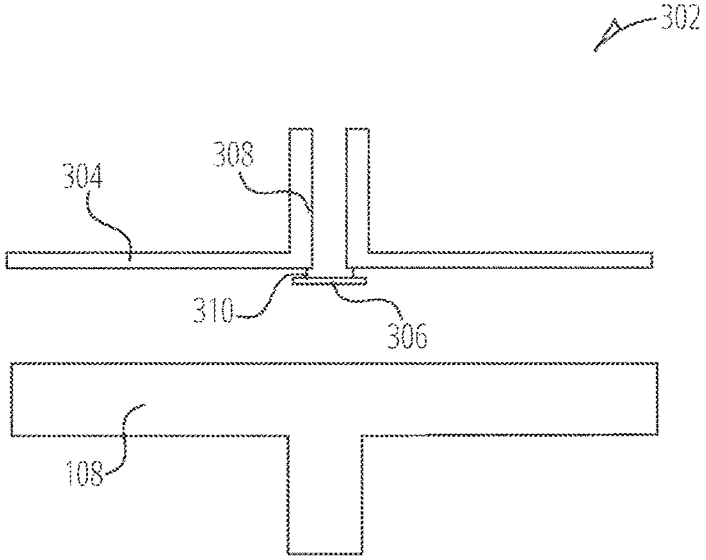
FIG. 3 illustrates an example faceless showerhead in accordance with an embodiment.

FIG. 3 illustrates a general arrangement of an example faceless showerhead 302 for use in a processing chamber such as a processing chamber 102 described above. The faceless showerhead 302 is devoid of a plenum, and devoid of a faceplate (hence “faceless”). The faceless showerhead 302 includes a backing plate 304 and a baffle 306. A gas supply stem 308 supplies precursors to the faceless showerhead 302. The baffle 306 is connected to the backing plate 304 or the gas supply stem 308 by one or more support elements 310. A support element 310 may act as a spacer or distancing element, in some examples. In some examples, the baffle 306 serves to retard and distribute precursor gas emanating from the lower end of the gas supply stem 308. The baffle 306 may, or may not, include holes formed therein. Other baffle 306 support or spacing arrangements are possible.

A phrase that may be used by skilled artisans when describing process optimization in the substrate-processing or semiconductor arts is the “adjustment of knobs”. This term relates to process factors or chamber parameters that can be fine-tuned to bring about a desired process or outcome, for example the creation of certain specified nano-sized features on a wafer, film thickness, or other substrate characteristics, for example. Various desired outcomes or results can be obtained or fine-tuned by “adjusting the knobs”.

Some examples of a faceless showerhead 302 enable such fine-tuning in various ways. Fine-tuning factors enabled by a faceless showerhead 302 may include, for example, a general configuration, position, or dimension of the faceless showerhead 302 per se or with respect to a substrate 106; a diameter, thickness, or other dimension of the baffle 306; an arrangement or configuration of holes in the baffle 306; a diameter or shape of holes in the baffle 306; a presence or absence of holes in the baffle 306; a separation distance between the baffle 306 and the gas supply stem 308; a separation distance between the baffle 306 and the backing plate 304; and a dimension or placement of a support element 310. Other fine-tuning factors are possible. For example, the baffle may be heated or cooled. The backing plate may be heated or cooled. In some examples, the backing plate assumes a particular configuration, such as including a convex or concave portion. A baffle 306 may be removable, or quickly replaceable by a baffle of an alternate configuration. Some specific examples of faceless showerheads are now described.

Figure 4A:
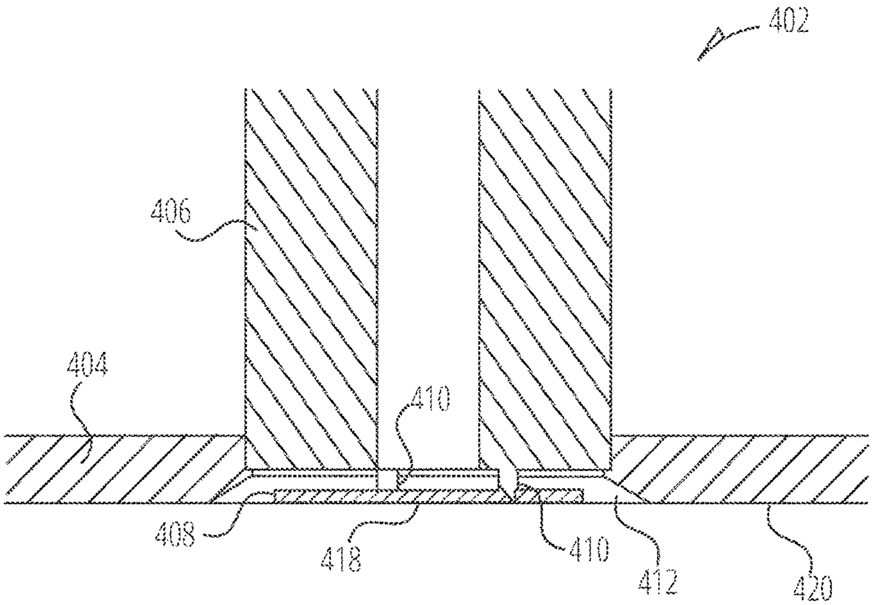
FIGS. 4A-6B illustrate aspects of the subject matter in accordance with example embodiments.
Figure 4B:
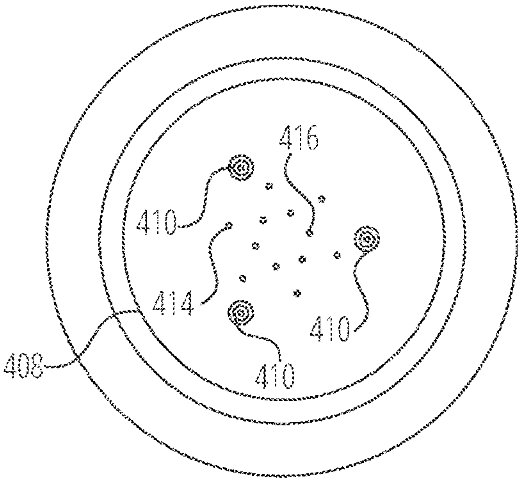
Figure 5A:
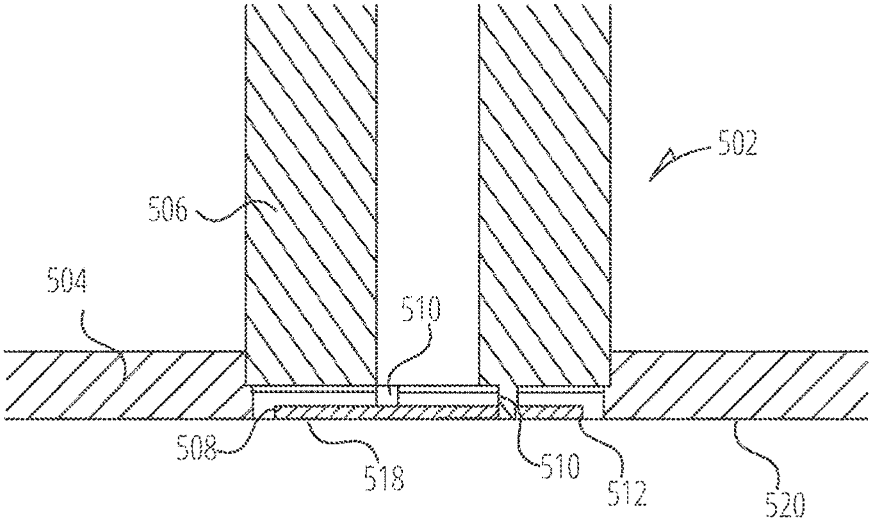
Figure 5B:
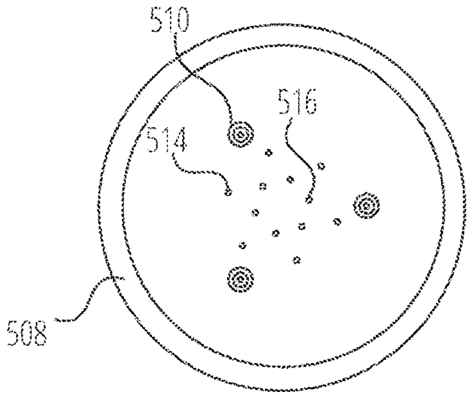
Figure 6A:
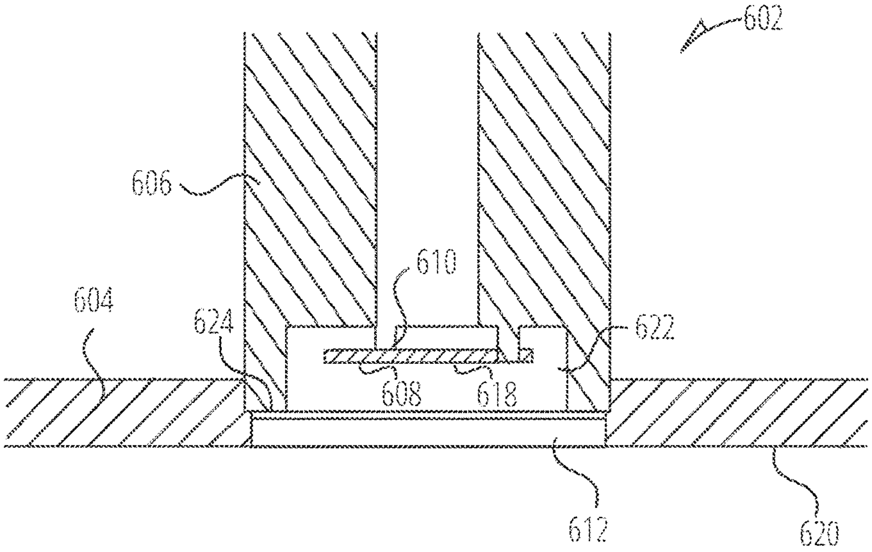
Figure 6B:
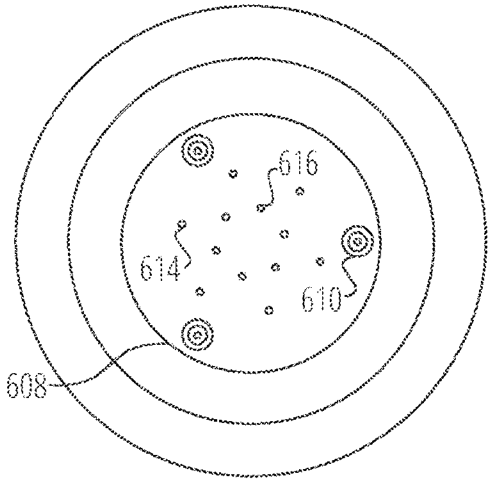

The faceless showerhead 402 illustrated in FIGS. 4A-4B includes a backing plate 404 and a gas supply stem 406. The faceless showerhead 402 includes a baffle 408 attached to a lower end of the gas supply stem 406 by one or more support elements 410. In this example, three support elements 410 are provided in the form of short rods, as shown in FIG. 4A. In some examples, the support elements 410 are arranged at equally spaced intervals around the center of the baffle 408 and at a specified distance therefrom. The baffle 408 is supported or nested within a baffle recess or cavity 412 of the backing plate 404. Here, the baffle cavity 412 includes a conical shape. The wider mouth of the conical shape may facilitate cleaning of deeper areas. Other baffle cavity shapes are possible, for example the cylindrical baffle cavity shown in FIG. 5A. In the example illustrated in FIG. 4A, an outer or lower surface 418 of the baffle 408 is coplanar with a lower surface 420 of the backing plate 404. Other baffle configurations, cavities, and support positions are possible.

In FIG. 4B, the baffle 408 is seen to include one or more through-holes 414 formed therein to allow passage and distribution of gas. In the illustrated example, six through-holes 414 are provided and arranged at equally spaced intervals in an outer circular pattern as shown. The illustrated example also includes six through-holes 416 arranged at equally spaced intervals in an inner circular pattern as shown. Other arrangements are possible. In some examples, the baffle is completely devoid of any through holes, or at least holes that serve as gas passages.

FIGS. 5A-5B and 6A-6B illustrate further examples of faceless showerheads 502 and 602. Corresponding components of the faceless showerheads 502 and 602 have been labelled in a manner similar to FIGS. 4A-4B. In the example showerhead 602 shown in FIGS. 6A-6B, the baffle 608 is positioned in a baffle cavity 622 provided in the stem 606 as opposed to the backing plate 604, for example. In this configuration, a lower surface 618 of the baffle 608 is not coplanar with a lower surface 620 of the backing plate 604. The surfaces 618 and 620 may be rendered coplanar, if desired, through use of an appropriately long support element 610. In the illustrated example, a cavity 612 is retained in the backing plate 604, but this feature is not necessarily present in other examples. In some embodiments, a lower surface 624 of the stem 606 may be rendered flush or coplanar with the lower surface 620 of the backing plate 604.

Figure 7:
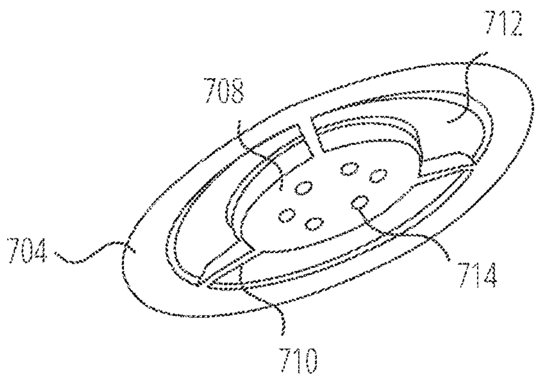
FIG. 7 illustrates an example baffle, in accordance with one embodiment.

The length, placement, or configuration of the support elements 410, 510, and 610 can be selected to create inter-relationships or functionality between and among the components of the faceless showerheads 402, 502, and 602 as desired. A given support element 410, 510 and 610 may be removed or quickly replaced by another support element 410, 510 and 610 of an alternate length or configuration. With reference to FIG. 7, for example, a baffle 708 is supported in a baffle cavity 712 by a support element 710 of an alternate configuration. In this example, a support element is provided in the form of a lateral support arm as opposed to an elongate rod. In this case, the baffle 708 is supported by an array of three, equally spaced, support arms 710 provided around a periphery of the baffle 708, as shown.

With reference to the accompanying figures, in some examples a diameter of the backing plate is in the range 12 mm-105 mm or 2.5 mm-13 mm. In some examples, a diameter of the baffle is in the range 12 mm-105 mm or 2.5 mm-13 mm. In the illustrated examples shown in the drawings, the diameter of the baffle is smaller than the diameter of the backing plate, for example in the nested-baffle configuration of FIG. 5A. In some examples, a thickness of the baffle is in the range 0.5 mm-3 mm. In some examples, a separation distance between the baffle and the backing plate is in the range 0.1 mm-6 mm. In some examples, a separation distance between the baffle and the gas supply stem is in the range 0.5 mm-6 mm. In some examples, a diameter of a through-hole is in the range 0.2 mm-10 mm. In some examples, a diameter of an inner or outer circular pattern is in the range 2 mm-100 mm. In some examples, a diameter of a support element is in the range 1 mm-10 mm and a length of the support element is in the range 0.5 mm-6 mm. Various combinations of the fine-tuning factors are possible to derive a desired process outcome.

Other shapes besides circular are possible for the baffle and the backing plate. For example, the baffle or backing plate could assume or include one or more different shapes, for example a triangular, hexagonal, crescent or amorphous shape. In some examples, a specific shape of the baffle or backing plate enables a further knob for tuning a given process.

In some examples, holes or posts are provided at or in the center of the baffle or the gas supply stem. In some examples, the gas supply stem includes a specific inner or outer diameter to enable a further process knob. In some examples, an inner diameter of a gas supply stem is in the range 2 mm to 80 mm. In some examples, an outer diameter of a gas supply stem is in the range 25 mm to 150 mm. In some examples, the inner or outer diameter of a stem may or may not be cylindrical, or circular in cylindrical outline.

Figure 8:
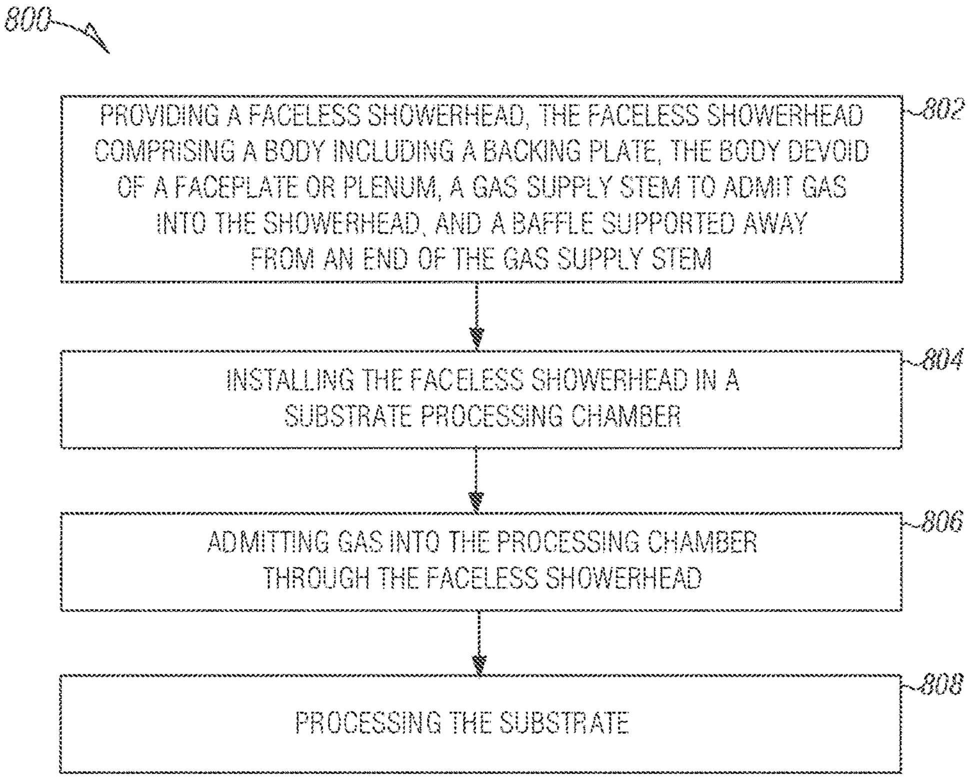
FIG. 8 is a flow chart including operations in a method, according to some examples.

Some present examples include methods. With reference to FIG. 8, a method 800 of processing a substrate comprises: at operation 802, providing a faceless showerhead, the faceless showerhead comprising a body including a backing plate, the body devoid of a faceplate or plenum, a gas supply stem to admit gas into the showerhead, and a baffle supported away from an end of the gas supply stem; at operation 804, installing the faceless showerhead in a substrate processing chamber; at operation 806, admitting gas into the processing chamber through the faceless showerhead; and, at operation 808, processing the substrate.

In some examples, the faceless showerhead includes any one or more of the features described elsewhere herein. In some examples, the method 800 further comprises striking a plasma in the substrate processing chamber, or not striking a plasma in the substrate processing chamber.

Although examples have been described with reference to specific example embodiments or methods, it will be evident that various modifications and changes may be made to these embodiments without departing from the broader scope of the embodiments. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This detailed description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A faceless showerhead comprising:

a body including a backing plate, the body devoid of a faceplate and plenum;

a gas supply stem to admit gas into the faceless showerhead, the gas supply stem comprising an intermediate surface and a lower surface, the intermediate surface and the lower surface defining a baffle cavity in the gas supply stem;

a baffle supported adjacent the intermediate surface of the gas supply stem, and at least one support element connecting the baffle with the intermediate surface for supporting the baffle in the baffle cavity in the gas supply stem, wherein a lower surface of the baffle is higher than both the lower surface of the gas supply stem and a lower surface of the backing plate.

2. The faceless showerhead of claim 1, wherein a diameter of the backing plate is in a range 12 mm-105 mm.

3. The faceless showerhead of claim 1, wherein a diameter of the baffle is in a range 2.5 mm-13 mm.

4. The faceless showerhead of claim 1, wherein a thickness of the baffle is in a range 0.5 mm-3 mm.

5. The faceless showerhead of claim 1, wherein a separation distance between the baffle and the backing plate is in a range 0.1 mm-6 mm.

6. The faceless showerhead of claim 1, wherein a separation distance between the baffle and the gas supply stem is in a range 0.5 mm-6 mm.

7. The faceless showerhead of claim 1, wherein the baffle includes an arrangement of one or more through-holes, and wherein a diameter of a through-hole is in a range 0.2 mm-10 mm.

8. The faceless showerhead of claim 7, wherein a diameter of an inner or outer circular pattern of the through-hole arrangement is in a range 2 mm-100 mm.

9. The faceless showerhead of claim 1, wherein a diameter of the support element is in a range 1 mm-10 mm, and wherein a length of the support element is in a range 0.5 mm-6 mm.

10. The faceless showerhead of claim 1, wherein a lower surface of the baffle is not coplanar with a lower surface of the backing plate.

* * * * *